United States Patent [19]
Takamori

[11] Patent Number: 5,325,093
[45] Date of Patent: Jun. 28, 1994

[54] ANALOG-TO-DIGITAL CONVERTER FOR COMPOSITE VIDEO SIGNALS

[75] Inventor: Tsutomu Takamori, Kanagawa, Japan

[73] Assignee: Sony Corporation, Tokyo, Japan

[21] Appl. No.: 880,112

[22] Filed: May 7, 1992

[30] Foreign Application Priority Data

May 8, 1991 [JP] Japan .................. 3-131649

[51] Int. Cl.$^5$ .......................................... H03M 1/12
[52] U.S. Cl. .................................. 341/155; 348/505
[58] Field of Search .............. 341/155, 157; 358/17, 358/19

[56] References Cited

U.S. PATENT DOCUMENTS

| | | | |
|---|---|---|---|
| 4,075,577 | 2/1978 | Walker | 331/17 |
| 4,636,836 | 1/1987 | Steckler et al. | 358/19 |
| 4,694,327 | 9/1987 | Demmer et al. | 358/19 |
| 4,847,678 | 7/1989 | McCauley | 358/19 |
| 4,989,073 | 1/1991 | Wagner | 358/19 |

FOREIGN PATENT DOCUMENTS

0217647A2  4/1987  European Pat. Off. .

*Primary Examiner*—Marc S. Hoff
*Attorney, Agent, or Firm*—Jerry A. Miller

[57] ABSTRACT

An analog-to-digital converter. The VCO 111 generates a sampling clock with a frequency four times that of a subcarrier. The A/D conversion circuit 103 converts an analog composite signal on the basis of the sampling clock thus generated. The BPF 113 extracts an input subcarrier from the digital composite signal. The local subcarrier reference generator 112 generates a local subcarrier. The multiplier 114 detects the phase differences between the input subcarrier and the local subcarrier. The averaging (I) circuit 115 averages consecutive 4 n phase differences. The averaging (II) circuit 116 further averages the averages thus obtained over a plurality of lines. The pulse generator 117 generates a pulse signal with a width corresponding to the averages thus obtained. The integrator 118 integrates the pulse signal thus generated thereby to control the oscillating frequency and phase of the VCO 111.

11 Claims, 5 Drawing Sheets

ANALOG-TO-DIGITAL CONVERTER FOR COMPOSITE VIDEO SIGNALS

BACKGROUND

1. Field of the Invention

The present invention relates generally to an analog-to-digital converter. More particularly, this invention relates to an analog-to-digital converter for converting an analog composite video signal into a digital composite video signal.

2. Background of the Invention

FIG. 1 shows a conventional analog-to-digital converter (hereinafter referred to simply as "A/D converter") for converting an analog composite video signal (hereinafter referred to simply as "analog composite signal") into a digital composite video signal (hereinafter referred to simply as "digital composite signal"). This circuit includes an amplifier 31 for amplifying an analog composite signal, a clock generating circuit 32 for generating a sampling clock with a frequency 4 $f_{sc}$ indicating that in this example the frequency is four times that of a subcarrier wave (hereinafter referred to simply as "subcarrier") superimposed as a color burst signal on the analog composite signal. This analog composite signal is amplified by the amplifier 31, and an A/D conversion circuit 33 converts the analog composite signal into a digital composite signal on the basis of the sampling clock generated by the clock generating circuit 32. The clock signal generated by clock generator 32 is fed forward to clock the A/D converter 33 in this circuit configuration.

The clock generator 32 of FIGURE i includes a band pass filter (BPF) 36 for filtering the output of the amplifier 31. This output is the amplified analog composite video signal which is to be converted to a digital composite signal. The BPF 36 output drives a burst gate 38 which in turn drives one input of a phase detector 40. The output of the phase detector 40 is processed by a pulse-width-to-voltage converter 44 (generally a low pass filter). The output voltage from pulse-width-to-voltage converter 44 is used to control the output frequency of a voltage controlled oscillator (VCO) 46, the output of which forms the output of the clock generator 32.

In the example shown, the VCO 46 operates at four times the sampling clock frequency $f_{sc}$. This output is also provided to a frequency divider 50 which in the example divides the output of the VCO by four and supplies the divided signal to a second input of the phase detector 40. The phase detector 40 compares the phase of the two inputs to obtain the error signal to converter 44. Those skilled in the art will recognize the structure of elements 40, 44, 46 and 50 as a frequency multiplying phase-locked-loop (PLL). The analog-to-digital converter 33 processes the analog composite video signal from amplifier 31 to produce the desired digital composite signal.

In one embodiment of the present invention, the digital composite signal output conforms to relevant standards, for instance, so-called D - 2 Format as defined by the National Television System Committee (NTSC).

D - 2 Format is stipulated in standards 244 M to 248 M formulated by the American National Standard Institute (ANSI) and the Society of Motion Picture and Television Engineers (SMPTE) which are hereby incorporated by reference. As the main coding parameters of D - 2 Format, the sampling frequency is 4 $f_{sc}$, the quantization type is linear 8-bit (10-bit for a color burst signal portion) quantization, and the sampling phase is an IQ axis for precise restriction of a color signal (hereinafter referred to as "IQ signal").

Accordingly, the PLL of the clock generating circuit 32 is designed to generate a sampling clock on the basis of a subcarrier superimposed as a color burst signal on the analog composite signal amplified by the amplifier 31. The sampling clock thus generated has a frequency of 4 $f_{sc}$ and a phase of 123 degrees relative to the subcarrier. To ensure these settings of the sampling clock, the clock generating circuit 32 is pre-adjusted before shipment, for instance, during manufacture.

Even though the clock generating circuit 32 is pre-adjusted during manufacture as mentioned above, the phase setting of the sampling clock may vary for such causes as changes with time in temperature characteristics of electrical elements of the PLL and fluctuations in supply voltage. As a result, the digital composite signal output by the A/D converter may fail to conform to relevant standards. Further, such pre-adjustment requires additional processes during manufacture. These problems are addressed with the present invention.

SUMMARY OF THE INVENTION

It is an object of the present invention to provide an improved analog-to-digital converter for processing composite video signals.

It is another object of the present invention to provide an analog-to-digital converter that requires no such pre-adjustment and operates in a stable manner for all fluctuations in temperature, supply voltage, and other conditions.

It is an advantage that the present invention uses feedback control techniques to achieve stable performance without requiring adjustment.

It is a feature that the present invention provides stable performance of the PLL of a video A/D converter with reduced jitter.

These and other objects, advantages and features of the invention will become apparent to those skilled in the art upon consideration of the following description of the invention.

To achieve the above-mentioned objects, the present invention provides an A/D converter including a voltage-controlled oscillator for generating a sampling clock with a frequency m times that of a subcarrier wave. An analog-to-digital converter converts an analog composite video signal into a digital composite video signal for output on the basis of the sampling clock generated by the voltage-controlled oscillator. A bandpass filter extracts a color burst signal from the digital composite video signal output by the analog-to-digital converter. A local subcarrier reference generator generates a subcarrier wave on the basis of the sampling clock generated by the voltage-controlled oscillator. A multiplier multiplies the subcarrier wave generated by the local oscillating means by the color burst signal extracted by the bandpass filter to detect phase differences between the subcarrier wave and the color burst signal. An averager averages consecutive M*N phase differences detected by the multiplying means, and an integrator integrates output from the averager to control the oscillating frequency and phase of the voltage-controlled oscillator.

Further, the integrator may include a pulse signal generator for generating a pulse signal with a width corresponding to the average output of the averager, and a pulse signal integrator for integrating the pulse signal generated by the pulse signal generator.

According to the present invention, the voltage-controlled oscillator generates a sampling clock with a frequency m times that of a subcarrier wave, and the analog-to-digital converter converts an analog composite video signal into a digital composite video signal for output on the basis of the sampling clock thus generated. Then, the bandpass filter extracts a color burst signal from the output digital composite video signal. The local subcarrier reference generator generates a subcarrier wave on the basis of the sampling clock, the multiplier multiplies the subcarrier wave by the color burst signal to detect phase differences between the subcarrier wave and the color burst signal. The averager averages consecutive M*N phase differences, and the integrator integrates the averages to control the oscillating frequency and phase of the voltage-controlled oscillator.

Further, according to the present invention, the pulse signal generator generates a pulse signal with a width corresponding to the average output of the averager. The pulse signal integrator integrates the pulse signal thus generated to control the oscillating frequency and phase of the voltage-controlled oscillator.

The features of the invention believed to be novel are set forth with particularity in the appended claims. The invention itself however, both as to organization and method of operation, together with further objects and advantages thereof, may be best understood by reference to the following description taken in conjunction with the accompanying drawing.

DESCRIPTION OF THE INVENTION

Figure 1:
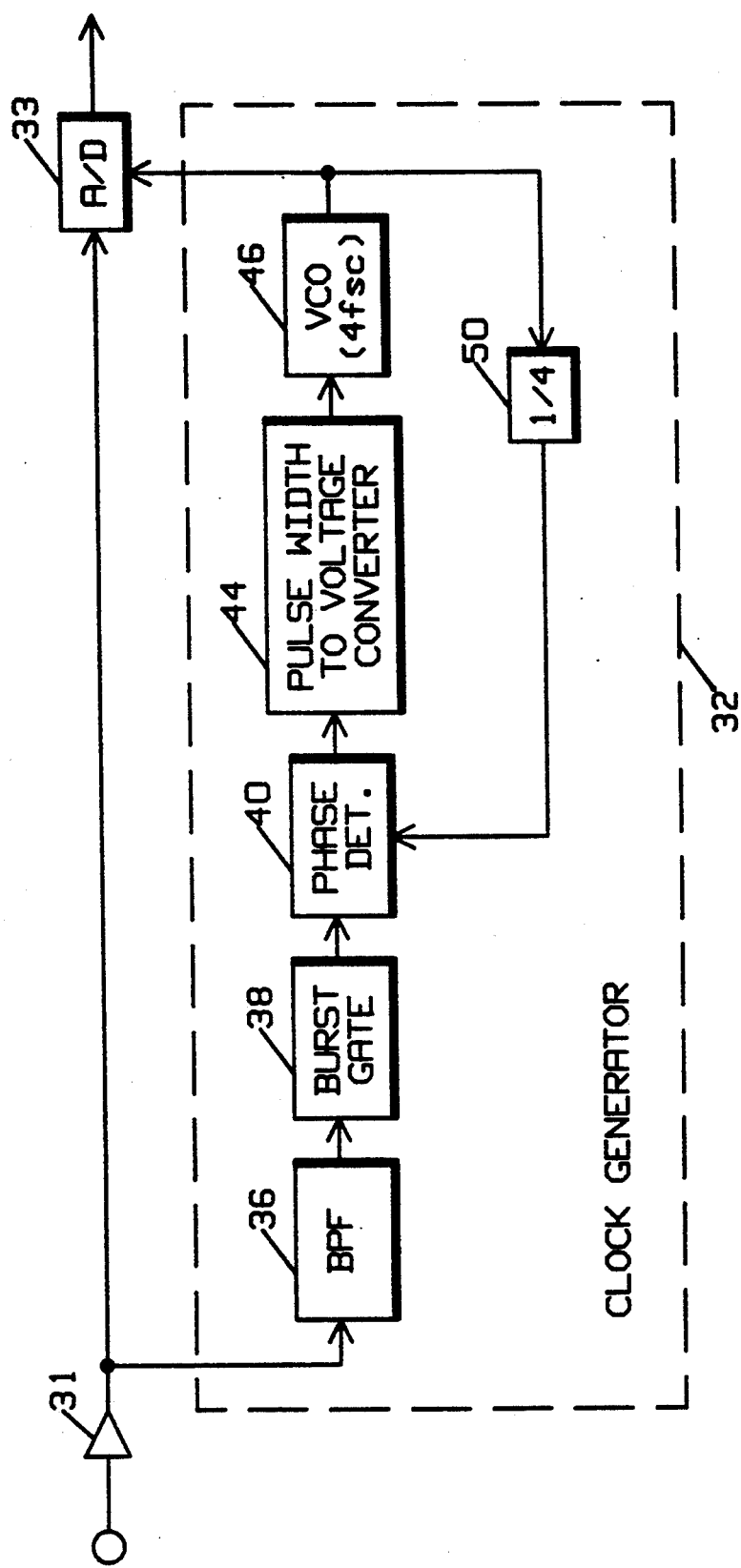
FIG. 1 is a block diagram showing the arrangement of an A/D converter according to the prior art.
Figure 2:
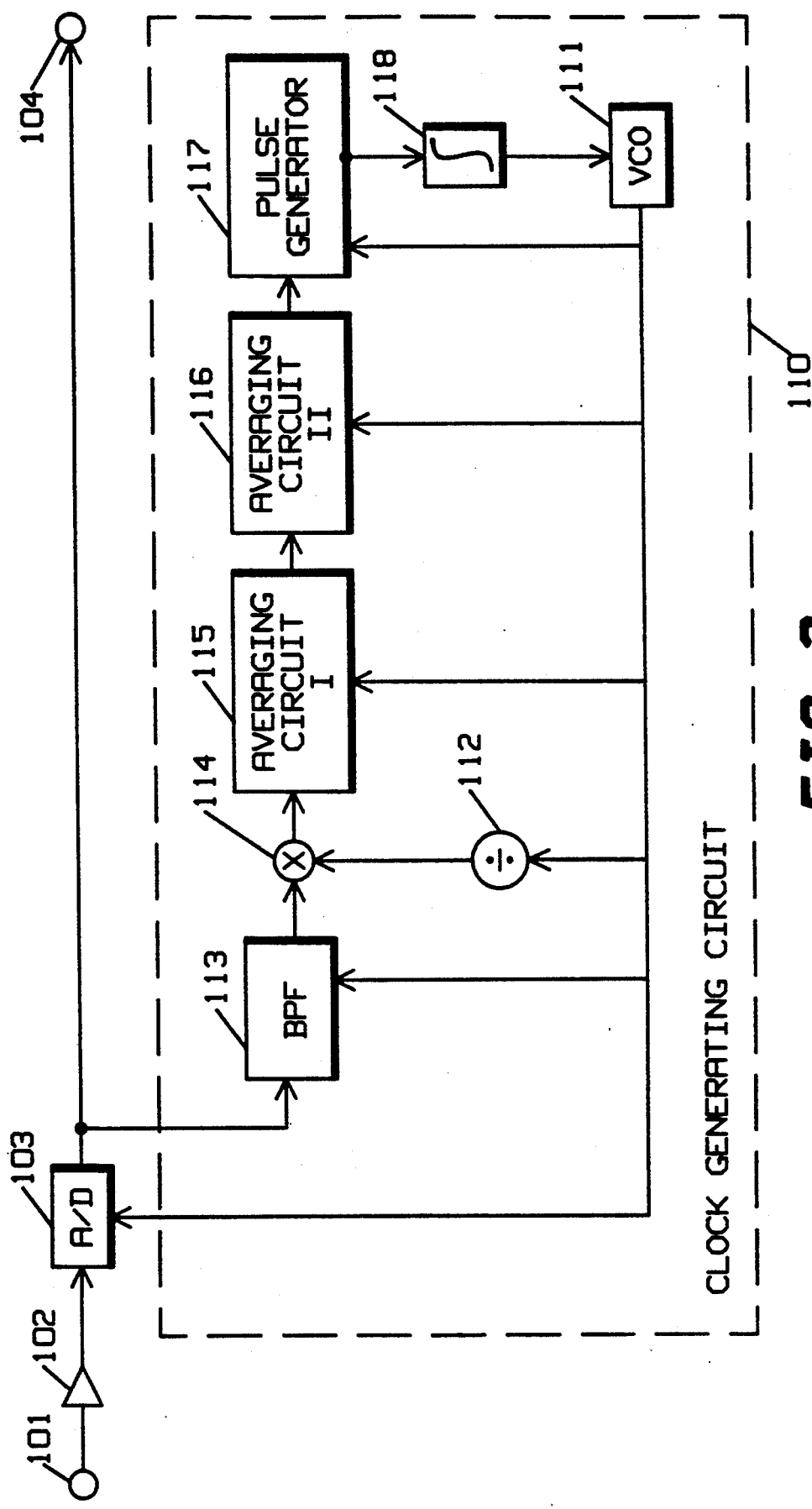
FIG. 2 is a block diagram showing the arrangement of an A/D converter according to one preferred embodiment of the present invention.

Referring to FIG. 2, one embodiment of the present invention is an analog-to-digital converter for converting an analog composite video signal (appearing at an input terminal 101) into a digital composite video signal conforming to relevant standards, for instance, D - 2 Format provided by the NTSC. The analog-to-digital converter (hereinafter referred to simply as "A/D converter") includes an amplifier 102 for amplifying an analog composite video signal (hereinafter referred to simply as "analog composite signal"), an A/D conversion circuit 103 for converting the analog composite signal amplified by the amplifier 102 into a digital composite video signal (hereinafter referred to simply as "digital composite signal") for output at terminal 104, and a clock 15 generating circuit 110 for generating a sampling clock on the basis of the digital composite signal output by the A/D conversion circuit 103 for supply to the A/D conversion circuit 103. In the present invention, the clock generating circuit 110 also uses phase locking techniques to lock onto the composite video subcarrier. However, the clock generating circuit 110 is used in a feedback loop to provide better control than in conventional circuits. The clock generating circuit 110 locks onto the output of the A/D converter 103 and adjusts the clock pulse timing driving the A/D converter 103 under feedback control in order to properly lock onto the phase of the color subcarrier of the composite video signal. Thus, the A/D converter is designed to convert an analog composite signal supplied via terminal 101 into a digital composite signal conforming to D - 2 Format output at terminal 104.

The clock generating circuit 110 of this embodiment includes a voltage-controlled oscillator (hereinafter referred to simply as "VCO") 111 for generating a sampling clock with a frequency, for instance, four times that of a subcarrier wave (hereinafter referred to simply as "subcarrier"). A local subcarrier reference generator 112 divides the output frequency of the sampling clock generated by the VCO 111 by four to generate a local subcarrier wave (hereinafter referred to simply as "local subcarrier"). A bandpass filter (hereinafter referred to simply as "BPF") 113 extracts a subcarrier (hereinafter referred to as "input subcarrier") superimposed as a color burst signal on the digital composite signal output by the A/D converter 103, and a multiplier 114 multiplies the input subcarrier extracted by the BPF 113 by the local subcarrier generated by the VCO 111 to detect phase differences between the input subcarrier and the local subcarrier.

In order to prevent the output of the clock generating circuit from jittering, the present invention preferably includes a pair of averaging circuits. Averaging (I) circuit 115 averages four consecutive n phase differences detected by the multiplier 114. Averaging (II) circuit 116 further averages the averages output by the averaging (I) circuit 115 over a plurality of horizontal lines. In general, M,N consecutive phase differences are averaged. A pulse generator 117 generates a pulse signal with a width corresponding to the average output by the averaging (II) circuit 116. An integrator 118 integrates the pulse signal generated by the pulse generator 117 thereby to control the oscillating frequency and phase of the VCO 111.

Thus, the clock generating circuit 110, forming one type of phase-locked loop (PLL), is designed to lock and generate a sampling clock with a frequency (hereinafter referred to as 4 $f_{sc}$) four times that of and a phase of 123 degrees relative to the input subcarrier superimposed as a color burst signal on the digital composite signal converted from the analog composite signal.

Figure 3A:
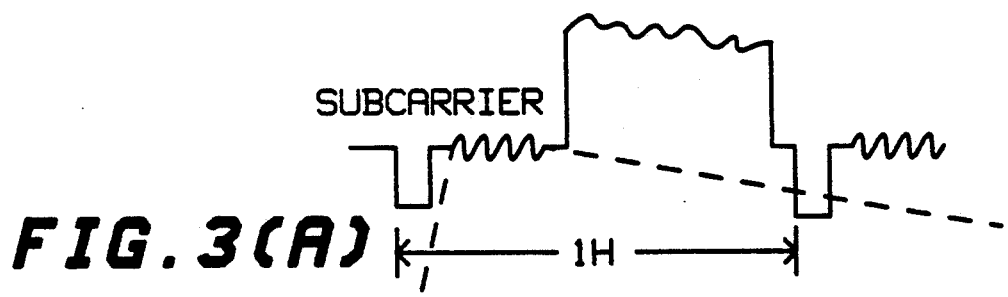
FIG. 3 embodied in FIG. 3(A) through FIG. 3(G) shows a sequence of signals present in the circuit of FIG. 2.
Figure 3B:
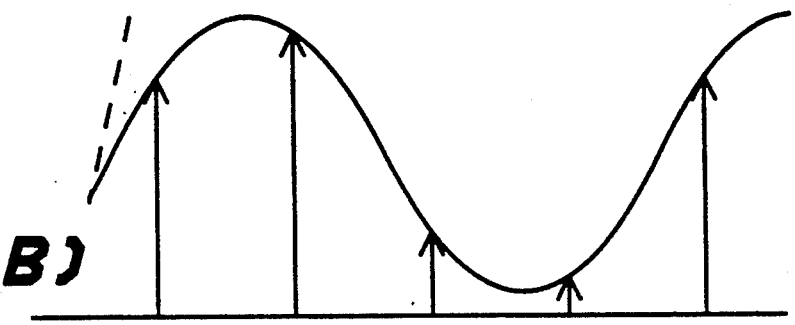

Referring to FIG. 3, in conjunction with FIG. 2, FIG. 3(A) shows one horizontal line of the analog composite video signal present at terminal 101. FIG. 3(B) represents the output signal present at terminal 104 of FIG. 2.

Figure 3C:
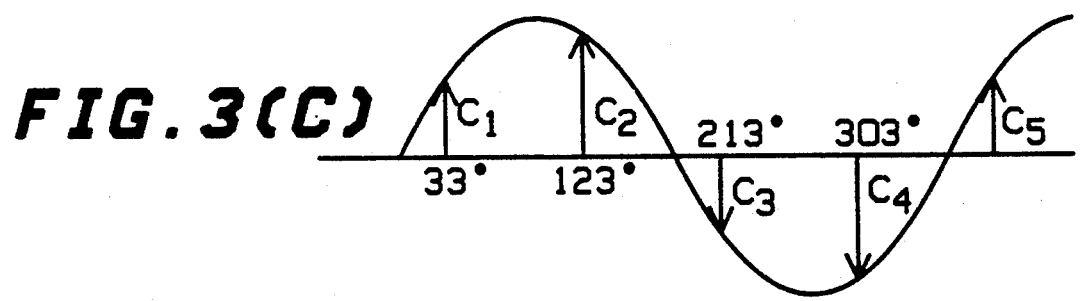

The BPF 113 has a pass band at the color subcarrier frequency and thus gates the color burst signal portion of the digital composite signal output by the A/D converter 103 thus extracting the input subcarrier for supply to the multiplier 114. The output of BPF 113 is represented in FIG. 3(C) for the case of an ideal D - 2 digital composite video signal.

The averaging (I) circuit 115 averages consecutive 4 n voltages corresponding to phase differences between the input subcarrier and the local subcarrier, namely, consecutive 4 or 8 voltages and so on during color burst. For instance, when the phase difference between the input subcarrier and the local subcarrier is 90 degrees, the averaging (I) circuit 115 outputs 0.0 volts.

The averaging (II) circuit 116 further averages the averages output by the averaging (I) circuit 115 over a plurality of horizontal lines. Thus, averaging (II) circuit 116 provides more of a long term average as its output so that the PLL operates in a more stable manner without responding too quickly to spurious variations.

The pulse generator 117 generates a pulse width modulated signal with a width corresponding to the average output by the averaging (II) circuit 16 for supply to the integrator 118. The integrator 118 integrates the pulse signal thus generated to thereby control the oscillating frequency and phase of the VCO 111. In an alternative embodiment, other forms of pulse time modulation could be used by generator 117, for example pulse position modulation could be used in which the amount of time between consecutive pulses is modulated according to the output of the averaging circuits. In either case, the integrator output 118 converts the pulses to an analog control signal for controlling the VCO 111.

Figure 3D:
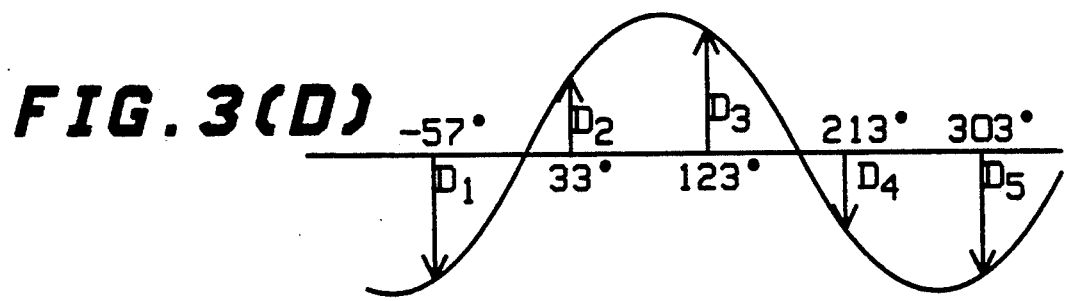
Figure 3E:
Figure 3F:
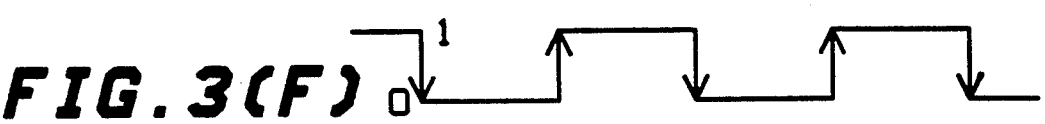
Figure 3G:
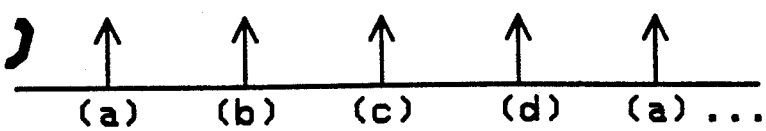

The local subcarrier reference generator 112 divides the sampling clock thus generated by four while generating a local subcarrier with a phase of 123 degrees ahead of the sampling clock. This is preferably done by delaying the resulting signals by 237 (360−123) degrees as shown in FIG. 3(D). In the ideal locked condition, the phase difference approaches 90 degrees at multiplier 114 in which case the average approaches zero. That is:

when $\Delta\theta \rightarrow 90°$ then $\dfrac{C_1 * D_1 + C_2 * D_2 + C_3 * D_3 + C_4 * D_4}{4} \rightarrow 0$ wherein $C_1$, $C_2$, $C_3$, and $C_4$ are samples of the subcarrier of the input video signal, shown in FIG. 3(C), sampled according to the clock pulse of FIG. 3(G). The level of the samples is SIN(33°), SIN(123°), SIN(213°), and SIN(303°) respectively. $D_1$, $D_2$, $D_3$, and $D_4$, shown in FIG. 3(D), are local subcarrier reference signals, generated by the local, subcarrier reference generator 112. The level of $D_1$, $D_2$, $D_3$, and $D_4$ is SIN(−57°), SIN(33°), SIN(123°), and SIN(213°) respectively.

The multiplier 114 thus generates voltages corresponding to the phase differences between the input subcarrier and the local subcarrier generated by the local subcarrier reference generator 112 for supply to the averaging (I) circuit 115.

Figure 4:
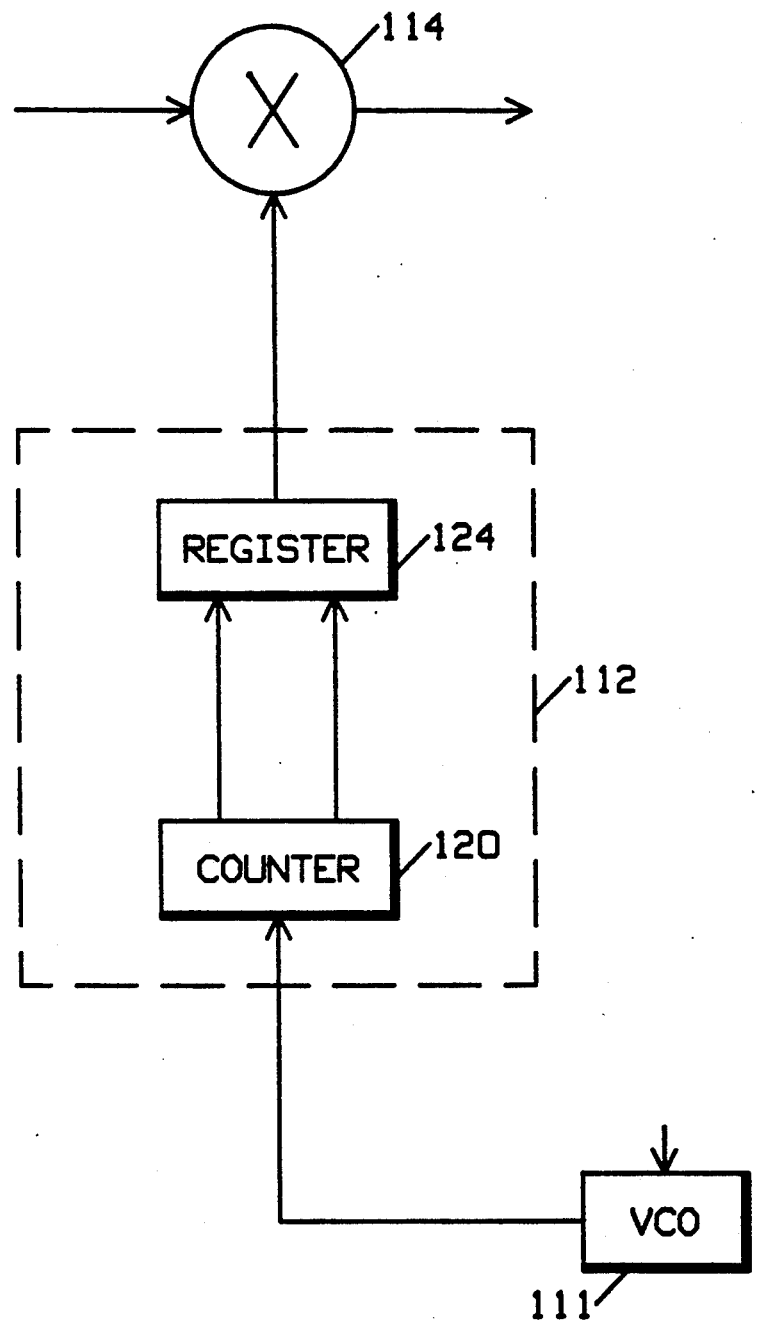
FIG. 4 is a more detailed block diagram of local subcarrier reference generator 112.

Turning briefly to FIG. 4, local subcarrier reference generator 112 includes a counter 120 and a register 124 like this.

The input to this counter 120 is the clock output generated by the VCO 111 which has a frequency of n times the frequency of the subcarrier of the input video signal of FIG. 3(A). In the preferred embodiment, the VCO output is a stream of pulses at 4 $f_{sc}$. The counter 120 generates a pair of streams of pulses as shown in FIGS. 3(E) and 3(F). The inverted timing of the pulses of FIG. 3(F) corresponds to the clock pulses of FIG. 3(F). The pulses of FIG. 3(E) invert in response to every rising or falling edge of the pulses of FIG. 3(F). Thus, four different cyclic addresses are made by the pulses of FIG. 3(E) and 3(F) corresponding to binary addresses 00, 01, 10 and 11.

For example, at the time (a) of FIG. 3(G) the address is (0,0), because the pulse of FIG. 3(F) indicates "0" and the pulse of FIG. 3(E) indicates "0". At the time (b) the address is (1,0) because the pulse of FIG. 3(F) indicates "1" and the pulse of FIG. 3(E) indicates "0". At the time (c) the address is (0,1). And the time (d) the address is (1,1). In other embodiments more or fewer addresses could be generated. These four different cyclic addresses are outputs of the counter 120 and inputs the register 124.

Register 124 generates a reference signal having a level which corresponds to the addresses. At the time (a) the register generates a reference signal D1 the level of which is SIN(−57°) in response to the address (0,0). At the time (b) the register generates a reference signal D2 the level of which is SIN(33°) in response to the address (1,0). In the same way, the register generates a signal having the level SIN(123°) at the time (c) and a signal having the level SIN(213°) at the time (d), and these four different reference signals are generated cyclically.

When the subcarrier of the input video signal is the sine wave signal like the broken curve of FIG. 3(C), that is, the curve of FIG. 3(D) is 90° the signal (C1, C2, C3, C4) phase difference between the curve of FIG. 3(C) and the sampled according to the clock pulse of FIG. 3(G) has a level SIN(33°) SIN(123°) SIN(213°) and SIN(303°) respectively, the averaging circuit 115 calculates the average as:

$$\text{Average} = \dfrac{C_1 * D_1 + C_2 * D_2 + C_3 * D_3 + C_4 * D_4}{4} = 0$$

In an alternative embodiment the average may be computed in the averaging circuits as follows:

$$\text{Average} = \dfrac{(C_1' * D_1 + C_2' * D_2) - (C_3' * D_3 + C_4' * D_4)}{4}$$

Those skilled in the art will appreciated that in this embodiment, as the difference in phase approaches 0 degrees, the average approaches 0 (rather than one). Suitable modification of the remaining circuitry to accommodate this modification will be evident to those skilled in the art.

Figure 5C:
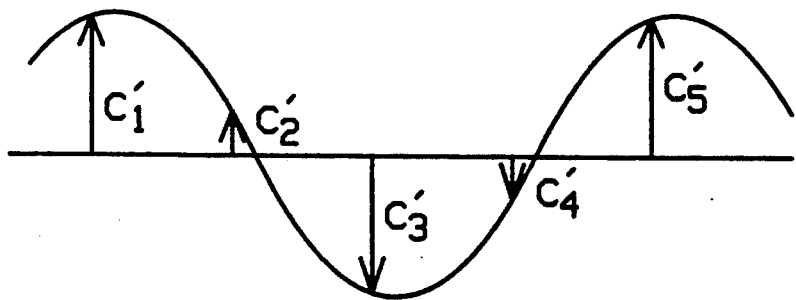
FIG. 5 embodied in FIG. 5(C) and 5(D) shows a sequence of signals present when the system is not yet locked
Figure 5D:
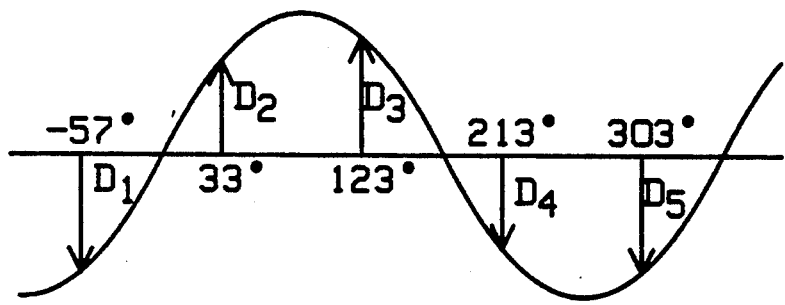

Referring now to FIG. 5(C') and FIG. 5(D), the curve C', shown in FIG. 5(C'), and curve D, shown in FIG. 5(D) are analogous to FIGS. 3(C) and 3(D) except that the 90 degree phase difference does not exist. When the subcarrier of the input video signal is the SIN signal like the curve (C') and curve (D) is not 90°, out of phase therewith, the averaging circuit determines that:

$$\text{Average} = \dfrac{C_1 * D_1 + C_2 * D_2 + C_3 * D_3 + C_4 * D_4}{4} \neq 0$$

The output of averaging means is converted into an analog signal by the digital/analog converter (118) and the analog output of (118) controls the VCO, so that the average as computed above is 0, bringing the phase difference back to 90° using feedback control.

The VCO 111 generates a frequency-controlled and phase-controlled sampling clock as shown in FIG. 3(G) for supply to the A/D converter 103 and the local subcarrier reference generator 112 to the pulse generator 117.

Accordingly, the clock generating circuit 110, forming one type of PLL, locks the sampling clock supplied by the VCO 111 when it has a frequency of 4 $f_{sc}$ and a phase of 123 degrees relative to the input subcarrier superimposed as a color burst signal on a digital composite signal converted from an analog composite signal by the A/D conversion circuit 103. It then supplies the sampling clock for the A/D conversion circuit 103.

On the basis of the sampling clock, the A/D conversion circuit 103 converts the analog composite video signal supplied via the terminal 101 into a digital composite video signal. The feedback control assures that variations due to component aging, etc. are compensated.

With the above-mentioned arrangement, the A/D converter converts an analog composite signal supplied via the terminal 101 into a digital composite signal for output on the basis of a sampling clock with a frequency four times that of and a phase of 123 degrees relative to an input subcarrier superimposed as a color burst signal on the digital composite signal. Namely, the A/D converter outputs a digital composite signal conforming to D - 2 Format.

Meanwhile, the A/D converter is designed to set the frequency and phase of the sampling clock on the basis of the digital composite signal converted from the analog composite signal by the A/D conversion circuit 103 rather than the analog composite video signal. Further, the A/D converter uses feedback control to prevent the frequency and phase settings of the sampling clock from varying for such causes as changes with time in temperature characteristics of electrical elements of the PLL and fluctuations in supply voltage. Therefore, the A/D converter, unlike the conventional ones, can prevent the phase setting of the sampling clock from varying due to fluctuations in temperature, supply voltage, and other conditions and invariably output a digital composite signal conforming to D - 2 Format. Another advantage of feedback control is to eliminate the need to pre-adjust the clock generating circuit 110 to ensure desired frequency and phase settings. In addition, the averaging (I) circuit 115 and the averaging (II) circuit 116 average phase differences as mentioned above, thereby inhibiting jitter of the sampling clock.

Since the phase of the sampling clock can be varied easily by changing the delay time of the local subcarrier reference generator 112, the A/D converter can Output a digital composite signal conforming to D - 2 Format even when supplied with an input analog composite signal whose subcarrier to horizontal sync (SCG) phase is not 0 degrees.

Further, since the sampling clock can be obtained through digital signal processing, the A/D converter can also be mounted on a single chip integrated circuit (IC), thereby reducing power consumption. The current invention can thus be implemented in hardware, software or firmware embodiments or combinations thereof.

Figure 6:
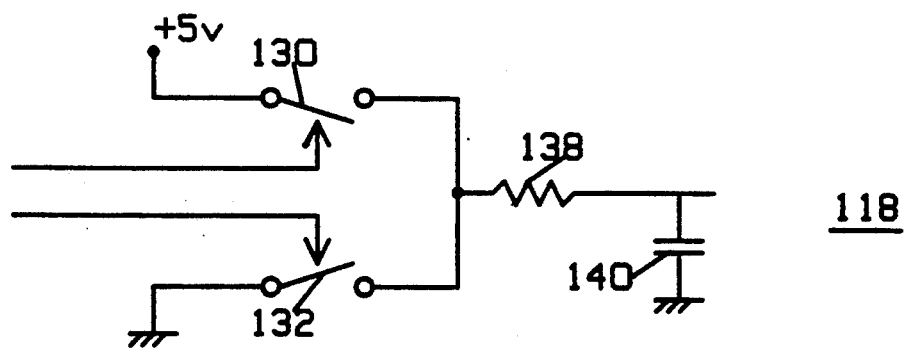
FIG. 6 is a circuit diagram of integrator 118.

Referring to FIG. 6, an integrator circuit suitable for use with the present invention is shown. The input signal from pulse generator 117 is used to control a pair of switches 130 and 132 which apply supply voltage and ground to a circuit made of series connected resistor 138 and capacitor 140 with the output taken at the junction of 138 and 140. Those skilled in the art will appreciate that other realizations of integrators (e.g. op-amp or software realizations) are also possible.

While the present invention has been described in one preferred embodiment thereof, it is to be understood that the present invention is not limited to those embodiments and that various changes and modifications may be made in the present invention without departing from the spirit and scope thereof. For instance, the present invention may also be applied to output a digital composite signal in such color television systems as phase alternation line (PAL) and sequential couleur a'memorie (sequential with memory) (SECAM).

Thus it is apparent that in accordance with the present invention, an apparatus that fully satisfies the objectives, aims and advantages is set forth above. While the invention has been described in conjunction with specific embodiments, it is evident that many alternatives, modifications, permutations and variations will become apparent to those skilled in the art in light of the foregoing description. Accordingly, it is intended that the present invention embrace all such alternatives, modifications and variations as fall within the scope of the appended claims.

What is claimed is:

1. An analog-to-digital converter comprising:
   a voltage-controlled oscillating means for generating a sampling clock with a frequency M times that of a subcarrier wave, where M is an integer;
   an analog-to-digital conversion means for converting an analog composite video signal into a digital composite video signal for output on the basis of said sampling clock generated by said voltage-controlled oscillating means;
   a bandpass filter for extracting a color burst signal from said digital composite video signal output by said analog-to-digital conversion means;
   a local subcarrier reference generating means for generating a subcarrier wave on the basis of said sampling clock generated by said voltage-controlled oscillating means;
   a multiplying means for multiplying said subcarrier wave generated by said local subcarrier reference generating means by said color burst signal extracted by said bandpass filter to detect phase differences between said subcarrier wave and said color burst signal;
   an averaging means for averaging consecutive M*N phase differences detected by said multiplying means where N is an integer; and
   digital to analog converting means for processing averages output by said averaging means thereby to control the oscillating frequency and phase of said voltage-controlled oscillating means.

2. An analog-to-digital converter as claimed in claim 1, further comprising an integrating means, wherein said integrating means comprises:
   a pulse signal generating means for generating a pulse signal with a width corresponding to said averages output by said averaging means; and
   a pulse signal integrating means for integrating said pulse signal generated by said pulse signal generating means.

3. An analog/digital converter according to claim 2, wherein said local subcarrier reference generator generating means comprises a counter for counting said clock pulse and means for outputting said reference signal, said reference signal having a level which corresponds to the output of said counter.

4. An analog/digital converter according to claim 1, wherein said averaging means further comprises second averaging means for averaging phase differences detected by said multiplying means over at least two horizontal periods.

5. An analog/digital converter according to claim 1, wherein said digital to analog converting means comprises integrating means for integrating said output of said pulse generating means.

6. An analog to digital converter for converting analog composite video signals into a digital format signal, comprising in combination:

said analog to digital converter including an input means for receiving said analog composite video signal, an output means for supplying said digital format signal, and a clock input for receiving a clock signal;

filtering means, responsive to said output means for selecting a subcarrier signal from said digital format signal;

a phase-locked loop connected to said filtering means and receiving said subcarrier signal for generating a clock signal output which is locked to said subcarrier signal, said clock signal output being supplied to said clock input of said analog to digital converter;

said phase-locked loop comprises a voltage controlled oscillator, a low pass filter and a phase detector for comparing the phase of said subcarrier signal and an output of said voltage controlled oscillator to produce a phase detector output; and, said phase-locked loop further comprising averaging means for averaging the output of said phase detector.

7. The apparatus of claim 6, wherein said averaging means includes a short term averaging means cascaded with a long term averaging means.

8. The apparatus of claim 7, wherein said long term averaging means produces an average of phase differences over a plurality of horizontal lines.

9. The apparatus of claim 7, wherein said short term averaging means produces an average over a plurality of samples from said analog to digital converter.

10. The apparatus of claim 6, wherein said averaging means includes a long term averaging means, said long term averaging means produces an average of phase differences over a plurality of horizontal lines.

11. The apparatus of claim 6, wherein said averaging means includes a short term averaging means, said short term averaging means produces an average over a plurality of samples from said analog to digital converter.

* * * * *